United States Patent [19]

Kubota

[11] Patent Number: 5,075,567

[45] Date of Patent: Dec. 24, 1991

[54] ELECTRONIC SWITCH CIRCUIT

[75] Inventor: Akihiro Kubota, Osaka, Japan

[73] Assignee: NEC Corporation, Japan

[21] Appl. No.: 545,920

[22] Filed: Jun. 29, 1990

[30] Foreign Application Priority Data

| Jun. 26, 1989 | [JP] | Japan | 1-168128 |
| Dec. 29, 1989 | [JP] | Japan | 1-340174 |
| Mar. 16, 1990 | [JP] | Japan | 2-66367 |

[51] Int. Cl.$^5$ ............................................. H03K 5/08
[52] U.S. Cl. .................................. 307/255; 307/355; 307/360; 307/494; 307/496
[58] Field of Search ............... 307/355, 356, 358, 360, 307/361, 494, 496, 255

[56] References Cited

U.S. PATENT DOCUMENTS

| 3,312,837 | 4/1967 | Flynn et al. | 307/496 |
| 3,688,128 | 8/1972 | Van Essen et al. | 307/360 |
| 4,182,963 | 1/1980 | Tamada et al. | 307/358 |
| 4,439,696 | 3/1984 | Yokoya | 307/494 |
| 4,506,171 | 3/1985 | Evans et al. | 307/494 |
| 4,525,636 | 6/1985 | Kominami et al. | 307/494 |
| 4,555,722 | 11/1985 | Harwood et al. | 307/360 |
| 4,609,863 | 9/1986 | Asai et al. | 307/358 |
| 4,642,482 | 2/1987 | Kasperkovitz et al. | 307/494 |
| 4,806,800 | 2/1989 | Khan | 307/494 |
| 4,970,416 | 11/1990 | Tamegaya | 307/496 |
| 4,980,579 | 12/1990 | McDonald et al. | 307/356 |

*Primary Examiner*—John Zazworsky
*Assistant Examiner*—Scott A. Ouellette
*Attorney, Agent, or Firm*—Laff, Whitesel, Conte & Saret

[57] ABSTRACT

An electronic switch circuit generates an output signal which is alternatively brought either into a first condition or into a second condition dependent upon a voltage level of an input signal. The electronic switch circuit includes first and second transistors which are mutually connected to form a differential circuit. A first bias circuit applies a first bias voltage to the first transistor. A second bias circuit applies to the second transistor a second bias voltage of a constant level which is independent of the voltage level of the input signal. The second bias voltage is different from the first bias voltage, when the voltage level of the input signal is smaller than a predetermined voltage level. When the voltage level of the input signal is not smaller than the predetermined voltage level, a control circuit operates to change the bias voltage for the second transistor so as to invert the large-and-small relationship between the bias voltages of the first and second transistors.

16 Claims, 2 Drawing Sheets

ELECTRONIC SWITCH CIRCUIT

BACKGROUND OF THE INVENTION

1. Field of the Invention

The present invention relates to an electronic switch circuit including a contactless switch composed of transistors, and more specifically to improvement of an electronic switch circuit used as a part of an electronic change-over device which is incorporated in for example a television receiver and a video tape recorder.

2. Description of Related Art

Recent television receivers and video tape recorders have been equipped with electronic change-over devices for controlling the conditions of a displayed image and an audio output, and these electronic change-over devices are adapted to be operated by for example a remote control device.

Most of electronic switch circuits used in the electronic change-over devices are composed of transistors so as to utilize an ON/OFF operation of a transistor which is obtained by changing a base-emitter voltage. For example, in a television receiver, switching signals of different levels corresponding to an audio output condition and a muting condition, respectively are selectively applied to a base of a transistor, so that the transistor is on/off-controlled dependently upon the level of the switching signal, with the result that an audio signal is selectively either outputted or muted.

Referring to FIG. 1, there is shown a circuit diagram of a typical conventional electronic switch circuit. The shown electronic switch circuit includes a pair of PNP transistors $Q_1$ and $Q_2$ having their commonly connected emitters which are connected through a constant current source $I_1$ to a high voltage supply line Vcc. A base of the transistor $Q_1$ is connected to an emitter of a PNP transistor $Q_3$, which has a base connected to a reference voltage $V_1$ and a collector connected to the ground GND. A collector of the transistor $Q_1$ is connected to a collector of an NPN transistor $Q_4$ having an emitter connected to the ground GND.

The electric switch circuit also includes a pair of NPN transistors $Q_5$ and $Q_6$ having their commonly connected collectors which are connected to the high voltage supply line Vcc. A base of the transistor $Q_5$ is connected to the collector of the transistor $Q_1$, and an emitter of the transistor $Q_5$ is connected to a base of the transistor $Q_4$ as well as a base of a switching transistor (not shown) incorporated in for example an external amplifying circuit (not shown).

A base of the transistor $Q_2$ is connected to an emitter of a PNP transistor $Q_7$, which has a base connected through a resistor $R_1$ to an input terminal $S_1$ and a collector connected to the ground GND. A collector of the transistor $Q_2$ is connected to a collector of an NPN transistor $Q_8$ having an emitter connected to the ground GND. A base of the transistor $Q_6$ is connected to the collector of the transistor $Q_2$, and an emitter of the transistor $Q_6$ is connected to a base of the transistor $Q_8$ as well as a base of another switching transistor (not shown) incorporated in the above mentioned external amplifying circuit (not shown).

In the above mentioned electronic switch circuit, if a voltage larger than the reference voltage $V_1$ (a high level signal H) is applied to the input terminal $S_1$, the transistor $Q_1$ is turned on and the transistor $Q_2$ is turned off, so that the transistor $Q_5$ outputs an control signal so as to turn on the first transistor of the not-shown external amplifying circuit.

On the other hand, if a voltage smaller than the reference voltage $V_1$ (a low level signal L) is applied to the input terminal $S_1$, the transistor $Q_1$ is turned off and the transistor $Q_2$ is turned on, so that the transistor $Q_6$ outputs another control signal so as to turn on the another transistor of the not-shown external amplifying circuit.

In bipolar transistors, when the transistor is on, a voltage difference corresponding to one diode will occur between a base and an emitter of the transistor. In the above mentioned electronic switch circuit, therefore, if an input signal of zero volt is inputted to the input terminal $S_1$ as the low level signal (L), a forward bias is applied between the base and the collector of the transistor $Q_2$, and therefore, the transistor $Q_2$ becomes difficult to turn on.

Assuming that a base-emitter voltage drop $V_{BE}$ is 0.7 volts, if the input signal of zero volt is inputted to the input terminal $S_1$, the collector of the transistor $Q_2$ is brought to 1.4 volts because of the turned-on transistors $Q_6$ and $Q_8$ and the emitter of the transistor $Q_2$ is brought to 0.7 volts because of the turned-on transistor $Q_7$, so that a forward bias of 0.7 volts is applied between the base and the collector of the transistor $Q_2$. Therefore, it is necessary to apply a voltage lower than the reference voltage $V_1$ to the input terminal $S_1$ in order to cause the transistor $Q_6$ to output the control signal, but, it is not a sufficient condition. Namely, under the above assumption, the voltage applied to the input terminal $S_1$ must be of 0.7 volts or more. Incidentally, this voltage is dependent upon a material of the transistor. In any case, a range of the switching voltage is limited. In addition, the transistors $Q_3$ and $Q_7$ can be omitted in the circuit shown in FIG. 1. In this case, however, the low level input voltage must be not smaller than 1.4 volts.

In general, the television receivers are such that an output signal outputted from a microcomputer is applied as the switching signal to the input terminal S1. However, the output signal of the microcomputer is for example 0 volt or 5 volts, and therefore, 0 volt is assigned to the low level signal. As mentioned above, if a signal of 0.7 volts or more is required as the low level signal, a new limitation is placed on a design of the output circuit of the microcomputer.

SUMMARY OF THE INVENTION

Accordingly, it is an object of the present invention to provide an electronic switch circuit which has overcome the above mentioned defect of the conventional one.

Another object of the present invention is to provide an electronic switch circuit capable of having a widened range of a switching voltage.

Still another object of the present invention is to provide an electronic switch circuit giving a reliable switching operation.

A further object of the present invention is to provide an electronic switch circuit which can be stably operated directly by an output signal from a microcomputer.

A still further object of the present invention is to provide an electronic switch circuit which can be easily implemented on a semiconductor integrated circuit.

The above and other objects of the present invention are achieved in accordance with the present invention by an electronic switch circuit for generating an output signal which is alternatively brought either into a first condition or into a second condition dependently upon a voltage level of an input signal. The electronic switch circuit comprises first and second transistors mutually connected in the form of a differential circuit, means for applying a first bias voltage to the first transistor, means for applying to the second transistor a second bias voltage of a constant level which is independent of the voltage level of the input signal and which is different from the first bias voltage, when the voltage level of the input signal is smaller than a predetermined voltage level, and means for changing the bias voltage for the second transistor so as to invert the large-and-small relation between the bias voltages of the first and second transistors when the voltage level of the input signal is not smaller than the predetermined voltage level.

The above and other objects, features and advantages of the present invention will be apparent from the following description of preferred embodiments of the invention with reference to the accompanying drawings.

DESCRIPTION OF THE PREFERRED EMBODIMENTS

Figure 1:
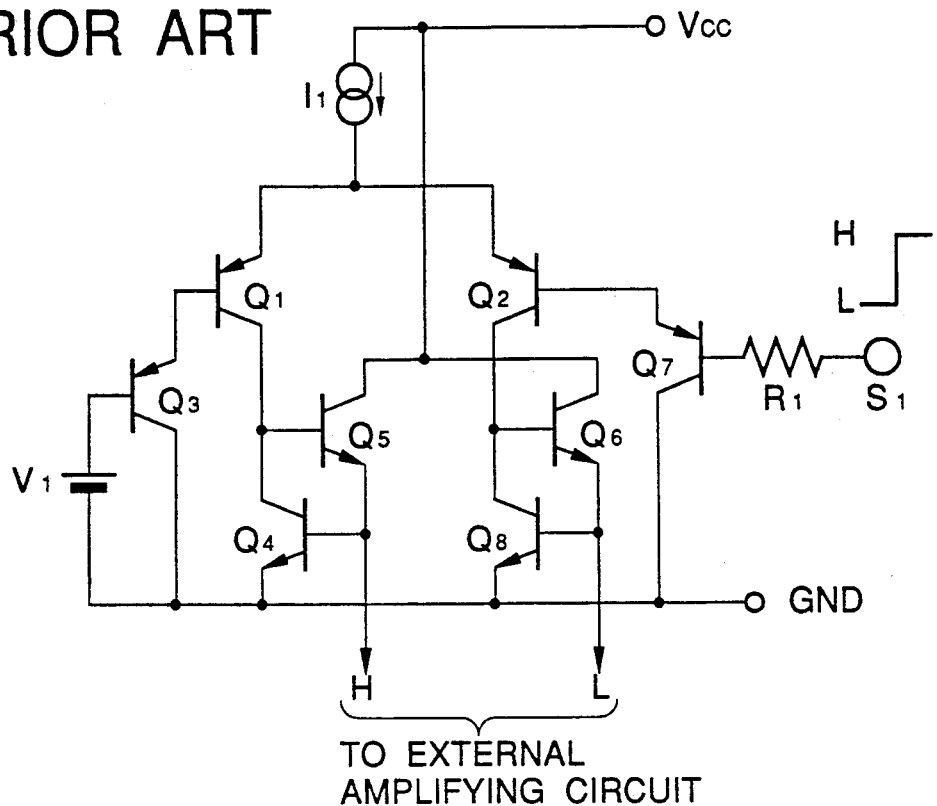
FIG. 1 is a circuit diagram of a conventional electronic switch circuit.
Figure 2:
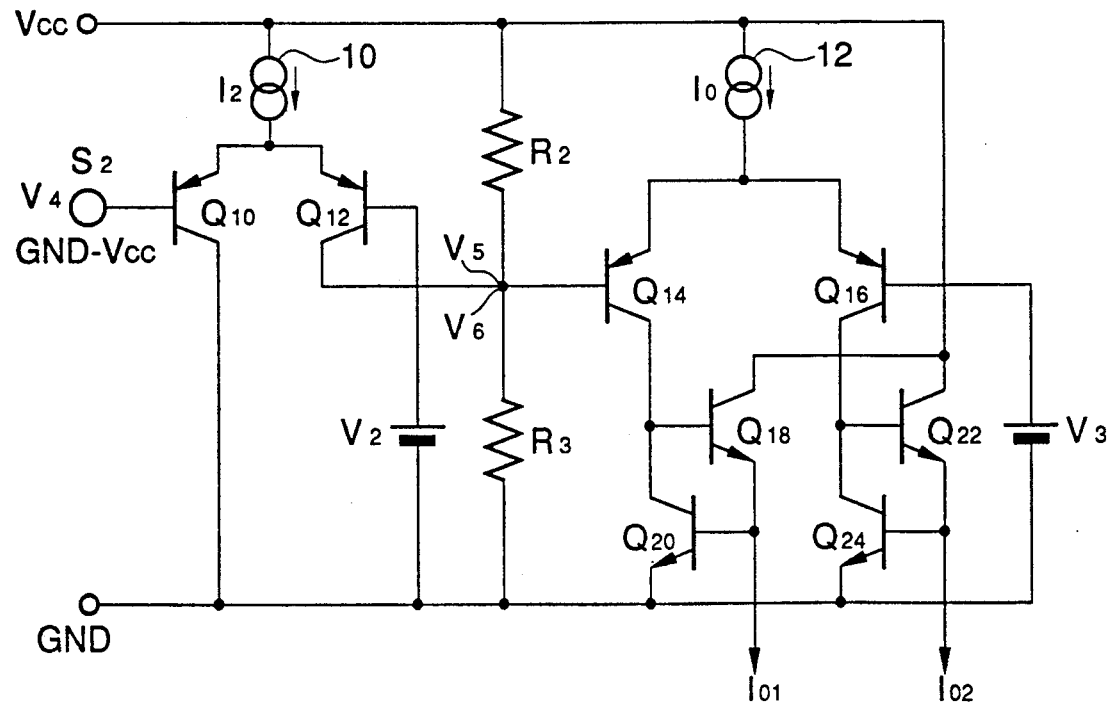
FIG. 2 is a circuit diagram of a first embodiment of the electronic switch circuit in accordance with the present invention.

Referring to FIG. 2, there is shown a circuit diagram of a first embodiment of the electronic switch circuit in accordance with the present invention.

The shown electronic circuit includes a pair of PNP transistors $Q_{10}$ and $Q_{12}$ having their commonly connected emitters which are connected through a constant current source 10 to a high voltage supply line Vcc. A base of the transistor $Q_{10}$ is connected to an input terminal $S_2$, and a collector of the transistor $Q_{10}$ is connected to a ground GND. On the other hand, a base of the transistor $Q_{12}$ is connected to a positive end of a reference voltage source $V_2$, whose negative end is connected to the ground GND. A collector of the transistor $Q_{12}$ is connected to a base of a PNP transistor $Q_{14}$. As seen from the above explanation and FIG. 2, a differential amplification circuit is formed by the transistors $Q_{10}$ and $Q_{12}$.

A base of the PNP transistor $Q_{14}$ is connected to the high voltage supply line Vcc through a resistor $R_2$ and to the ground GND through a resistor $R_3$. An emitter of the PNP transistor $Q_{14}$ is connected to an emitter of a PNP transistor $Q_{16}$, and the commonly connected emitters of the PNP transistors $Q_{14}$ and $Q_{16}$ are connected through a constant current source 12 to the high voltage supply line Vcc, so that a differential amplification circuit is formed by the transistors $Q_{14}$ and $Q_{16}$.

A collector of the transistor $Q_{14}$ is connected to a base of an NPN transistor $Q_{18}$ having a collector connected to the high voltage supply line Vcc and also to a collector of an NPN transistor $Q_{20}$ having an emitter connected to a base of the transistor $Q_{20}$ and to form a first output terminal.

A base of the transistor $Q_{16}$ is connected to a positive end of another reference voltage source $V_3$, whose negative end is connected to the ground GND. A collector of the transistor $Q_{16}$ is connected to a base of an NPN transistor $Q_{22}$ having a collector connected to the high voltage supply line Vcc and also to a collector of an NPN transistor $Q_{24}$ having an emitter connected to the ground GND. An emitter of the transistor $Q_{22}$ is connected to a base of the transistor $Q_{24}$ and to form a second output terminal.

The transistors $Q_{18}$ and $Q_{20}$ and the transistors $Q_{22}$ and $Q_{24}$ are in the Wilson type connection, respectively, and constitute external control circuits, respectively.

In the above mentioned electronic switch circuit, the reference voltage $V_3$ is determined as follows:

$$\{V_{cc} \times R_3/(R_2+R_3)\} < V_3$$

$$V_3 < \{V_{cc} \times R_3/(R_2+R_3)\} + (R_3 \times I_2)$$

where $I_2$ is a constant current flowing through the transistor $Q_{12}$ when it is turned on.

Now, an operation of the first embodiment will be explained.

Assume that an input voltage $V_4$ applied to the input terminal $S_2$ varies between zero volt (the ground level) and Vcc. If $V_4 < V_2$, the transistor $Q_{10}$ is turned on, and a base voltage $V_5$ of the transistor $Q_{14}$ becomes as follows:

$$V_5 = V_{cc} \times R_3/(R_2+R_3)$$

In this condition, the base voltage $V_5$ of the transistor $Q_{14}$ becomes smaller than the base voltage $V_3$ of the transistor $Q_{16}$, and therefore, the transistor $Q_{14}$ is turned on so that a current $I_{01}$ is supplied through the transistor $Q_{18}$.

If $V_4 > V_2$, the transistor $Q_{12}$ is turned on, so that the base voltage of the transistor $Q_{14}$ is raised to $V_6$, which is higher than $V_5$ by $(R_3 \times I_2)$. Therefore, since it becomes $V_3 < V_6$, the transistor $Q_{16}$ is turned on so that a current $I_{02}$ is supplied through the transistor $Q_{22}$.

As seen from the above, it is in the first embodiment that the voltage level $V_4$ of the input signal as the switching instructing voltage can be freely determined by suitably setting the reference voltages $V_2$ and $V_3$. In addition, even if the voltage level $V_4$ of the input signal is set to zero volt, the circuit can perform the switching operation.

Accordingly, the input voltage $V_4$ can have a wide tolerated range, and even if the high voltage supply voltage Vcc is low, a reliable and stable switching operation can be obtained.

Figure 3:
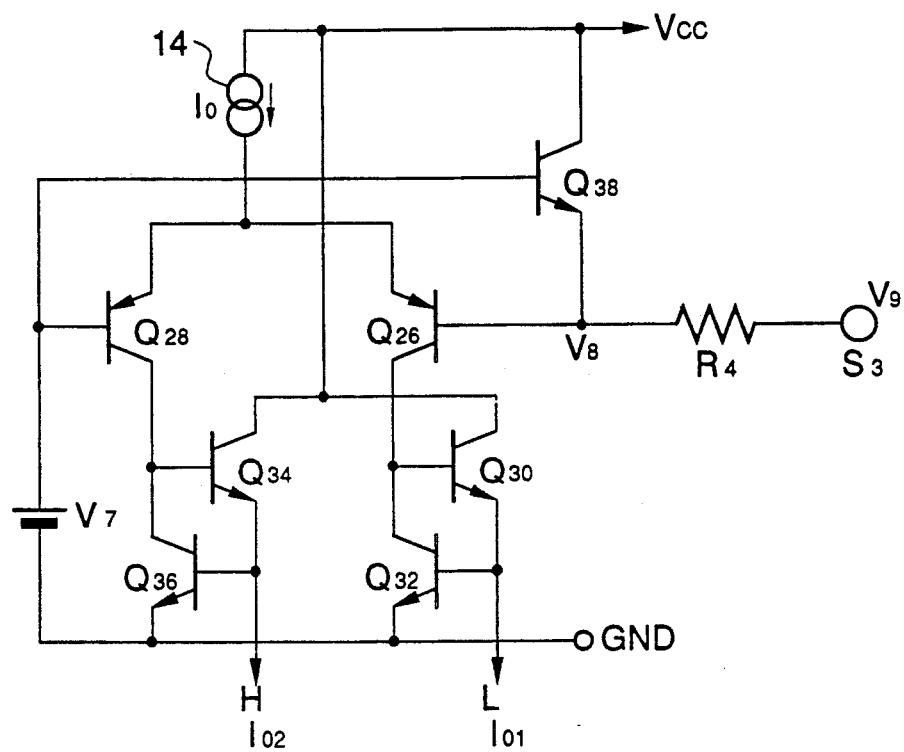
FIG. 3 is a circuit diagram of a second embodiment of the electronic switch circuit in accordance with the present invention.

Turning to FIG. 3, there is shown a circuit diagram of a second embodiment of the electronic switch circuit in accordance with the present invention.

The shown electronic circuit includes a pair of PNP transistors $Q_{26}$ and $Q_{28}$ having their commonly connected emitters which are connected through a constant current source 14 to a high voltage supply line Vcc, so that a differential amplification circuit is formed by the transistors $Q_{26}$ and $Q_{28}$. A base of the transistor $Q_{26}$ is connected through a resistor $R_4$ to an input terminal $S_3$, and a collector of the transistor $Q_{26}$ is connected to a base of an NPN transistor $Q_{30}$ having a collector connected to the high voltage supply line Vcc and also to a collector of an NPN transistor $Q_{32}$ having an emitter connected to the ground GND. An emitter of the transistor $Q_{30}$ is connected to a base of the transistor $Q_{32}$ and to form a first output terminal.

A base of the transistor $Q_{28}$ is connected to a positive end of a reference voltage source $V_7$, whose negative end is connected to the ground GND. A collector of the transistor $Q_{28}$ is connected to a base of an NPN transistor $Q_{34}$ having a collector connected to the high voltage supply line Vcc and also to a collector of an NPN transistor $Q_{36}$ having an emitter connected to the ground GND. An emitter of the transistor $Q_{34}$ is connected to a base of the transistor $Q_{36}$ and to form a second output terminal.

Namely, the transistors $Q_{30}$ and $Q_{32}$ and the transistors $Q_{34}$ and $Q_{36}$ constitute external control circuits, respectively.

In addition, the base of the transistor $Q_{28}$, namely the reference voltage $V_7$ is connected to a base of an NPN transistor $Q_{38}$, which has a collector connected to the high voltage supply line Vcc, and an emitter connected to the base of the transistor $Q_{26}$. With this arrangement, assuming that a base-emitter voltage of the transistor $Q_{38}$ is $V_{BE}$, when the transistor $Q_{38}$ is in an ON condition, a base voltage $V_8$ of the transistor $Q_{26}$ becomes $(V_7 - V_{BE})$. Namely, $V_8 = V_7 - V_{BE}$.

The electronic switch circuit shown in FIG. 3 operates as follows:

If an input voltage $V_9$ of the input terminal $S_3$ is smaller than the reference voltage $V_7$ ($V_9 < V_7$), the transistor $Q_{38}$ is turned on, so that the base potential $V_8$ of the transistor $Q_{26}$ becomes lower than the reference voltage $V_7$ ($V_8 < V_7$). As a result, the transistor $Q_{26}$ is turned on, and the transistor $Q_{30}$ outputs from its emitter an output current $I_{01}$ for a low level.

In this situation, even if the input voltage $V_9$ of the input terminal $S_3$ is zero volt, the base potential $V_8$ of the transistor $Q_{26}$ is biased by $V_7 - V_{BE}$.

If the input voltage $V_9$ rises and reaches the voltage $V_8$, the transistor $Q_{38}$ is turned off. Thereafter, the base potential of the transistor $Q_{26}$ is raised with increase of the input voltage $V_9$. When the input voltage $V_9$ becomes larger than the reference voltage $V_7$, the transistor $Q_{28}$ is turned on. As a result, the transistor $Q_{34}$ outputs from its emitter an output current $I_{02}$ for a high level.

As seen from the above, in this second embodiment, even if the input voltage $V_9$ as the switching voltage is zero volt, the base of the transistor $Q_{26}$ is properly biased by cooperation of the transistor $Q_{38}$ and the resistor $R_4$, so that a stable switching operation is ensured. Therefore, a wide tolerated range is obtained for the input voltage $V_9$, and an accurate switching operation is obtained even under a low supply voltage.

Figure 4:
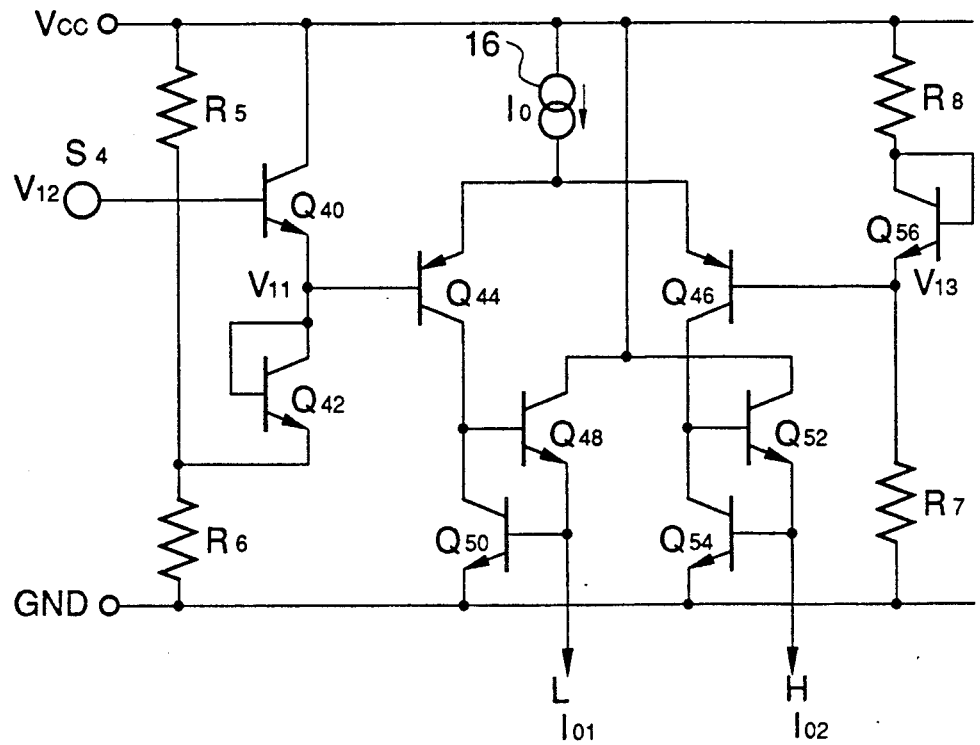
FIG. 4 is a circuit diagram of a third embodiment of the electronic switch circuit in accordance with the present invention.

Referring to FIG. 4, there is shown a circuit diagram of a third embodiment of the electronic switch circuit in accordance with the present invention.

The shown electronic circuit includes an NPN transistor $Q_{40}$ having a base connected to an input terminal $S_4$, and a collector connected to a high voltage supply line Vcc. An emitter of the transistor $Q_{40}$ is connected to a collector of another NPN transistor $Q_{42}$. This transistor $Q_{42}$ has a base connected to the collector of the transistor $Q_{42}$ itself. Namely, the transistor $Q_{42}$ is connected in the form of a diode. An emitter of the transistor $Q_{42}$ is connected to an connection node of resistors $R_5$ and $R_6$ series-connected between the high voltage supply line Vcc and the ground GND. A connection node between the transistors $Q_{40}$ and $Q_{42}$ is connected to a base of a PNP transistor $Q_{44}$.

An emitter of the PNP transistor $Q_{44}$ is connected to an emitter of an PNP transistor $Q_{46}$, and the commonly connected emitters of the PNP transistors $Q_{44}$ and $Q_{46}$ are connected through a constant current source 16 to the high voltage supply line Vcc, so that a differential amplification circuit is formed by the transistors $Q_{44}$ and $Q_{46}$.

A collector of the transistor $Q_{44}$ is connected to a base of an NPN transistor $Q_{48}$ having a collector connected to the high voltage supply line Vcc and also to a collector of an NPN transistor $Q_{50}$ having an emitter connected to the ground GND. An emitter of the transistor $Q_{48}$ is connected to a base of the transistor $Q_{50}$ and to form a first output terminal.

A collector of the transistor $Q_{46}$ is connected to a base of an NPN transistor $Q_{52}$ having a collector connected to the high voltage supply line Vcc and also to a collector of an NPN transistor $Q_{54}$ having an emitter connected to the ground GND. An emitter of the transistor $Q_{52}$ is connected to a base of the transistor $Q_{54}$ and to form a second output terminal. Thus, the transistors $Q_{48}$ and $Q_{50}$ and the transistors $Q_{52}$ and $Q_{54}$ constitute external control circuits, respectively.

A base of the transistor $Q_{46}$ is connected to an emitter of an NPN transistor $Q_{56}$ and an one end of a resistor $R_7$, which is grounded at its other end. A base and a collector of the transistor $Q_{56}$ are commonly connected to one end of another resistor $R_8$, which is connected at its other end to high voltage supply line Vcc.

The electronic switch circuit shown in FIG. 4 operates as follows:

If an input voltage $V_{12}$ of the input terminal $S_4$ is at zero volt, the transistor $Q_{40}$ is turned off. In this condition, a base potential $V_{11}$ of the transistor $Q_{44}$ is expressed as follows:

$$V_{11} = \{R_6 \times Vcc/(R_5 + R_6)\} + V_{BE} + (R_6 \times I_{42})$$

where $V_{BE}$ is a base-emitter voltage of the transistor $Q_{42}$, $I_{42}$ is a current flowing through the transistor $Q_{42}$. This current $I_{42}$ flowing through the transistor $Q_{42}$ corresponds to a base current of the transistor $Q_{44}$.

Here, the circuit is set so that $V_{11}$ becomes lower than the base potential $V_{13}$ of the transistor $Q_{46}$. Therefore, the transistor $Q_{44}$ is turned on, so that the transistor $Q_{48}$ outputs from its emitter an output current $I_{01}$ for a low level.

If the input voltage $V_{12}$ rises and becomes larger than the voltage $V_{11}$ by a base-emitter voltage $V_{BE40}$ of the transistor $Q_{40}$, the transistor $Q_{40}$ is turned on. Thereafter, the base potential of the transistor $Q_{44}$ is raised with increase of the input voltage $V_{12}$. Namely, the base potential of the transistor $Q_{44}$ becomes $(V_{12} - V_{BE40})$. When the base potential of the transistor $Q_{44}$ becomes larger than the base potential $V_{13}$ of the transistor $Q_{46}$, the transistor $Q_{44}$ is turned off. As a result, the output current $I_{01}$ for the low level is blocked, and the transistor $Q_{52}$ outputs from its emitter an output current $I_{02}$ for a high level.

As seen from the above, in this third embodiment, even if the input voltage $V_{12}$ as the switching voltage becomes low, the differential circuit is properly biased. In addition, since the bias can be freely set, a wide tolerated range is obtained for the input voltage $V_{12}$, and an accurate switching operation obtained even under a low supply voltage.

In the third embodiment, each of the transistor $Q_{42}$ and the transistor $Q_{56}$ functions as a connection means having a level shift function. Therefore, each of the transistor $Q_{42}$ and the transistor $Q_{56}$ can be deleted or can be replaced with a resistor.

It will be apparent from the above mentioned description of the embodiments, that the PNP transistors and the NPN transistors in each of the embodiments can be replaced by NPN transistors and PNP transistors, respectively, taking a polarity of the voltage supply into consideration. In this case, the bias voltage for the differential circuit in each embodiment is inverted. In addition, if a condition of outputting a current is deemed as a first switch condition and if another condition of outputting no current is regarded as a second switch condition, it is sufficient if only one of the output currents $I_{01}$ and $I_{02}$ is used.

The invention has thus been shown and described with reference to the specific embodiments. However, it should be noted that the present invention is in no way limited to the details of the illustrated structures but changes and modifications may be made within the scope of the appended claims.

I claim:

1. An electronic switch circuit for generating an output signal which is alternatively brought either into a first condition or into a second condition in response to a logical level of an input signal, said electronic switch circuit comprising an input terminal supplied with said other input signal, first and second transistors connected in a differential circuit, an output terminal coupled to said differential circuit to produce said output signal, first means for supplying a first voltage to a base of said first transistor, and second means coupled between said input terminal and said second transistor for supplying a base of said second transistor with a second voltage in response to a first logic level of said input signal and with a third voltage in response to a second logic level of said input signal, said second voltage turning off said second transistor while said first transistor is turned on and said third voltage turning on said second transistor for applying a reverse bias between the base and the collector of said second transistor while said first transistor is turned off.

2. A circuit as claimed in claim 1, wherein said second means comprises a third transistor having a base coupled to said input terminal, a fourth transistor connected to form a differential circuit together with said third transistor, said fourth transistor having a base supplied with a fourth voltage having a value between the first and second logic levels of said input signal and a collector coupled to the base of said transistor, a first resistor connected between the base of said second transistor and a first potential point and a second resistor connected between the base of said second transistor and a second potential point.

3. A circuit as claimed in claim 1, wherein said second means comprises a resistor connected between said input terminal and the base of said second transistor, and a third transistor having a base supplied with said first voltage and an emitter connected to the base of said second transistor.

4. A circuit as claimed in claim 1, wherein said second means comprises a voltage generator for generating said third voltage at an output side thereof, and a third transistor having a base coupled to said input terminal and an emitter coupled to the base of said second transistor and the output side of said voltage generator.

5. An electronic switch circuit for generating an output signal which is alternatively brought either into a first condition or into a second condition dependently upon a voltage level of an input signal, the electronic switch circuit comprising:

an input differential circuit composed of first and second transistors, one end of a current path of each of the first and second transistors being connected to each other and commonly connected through a first current source to a first voltage line, a control electrode of the first transistor being connected to receive the input signal and the other end of the current path of the first transistor being connected to a second voltage line, and a control electrode of the second transistor being connected to a first reference voltage;

first and second resistors series-connected between the first and second voltage lines, a connection node between the series-connected first and second resistors being connected to the other end of the current path of the second transistor; and an output differential circuit composed of third and fourth transistors, one end of a current path of each of the third and fourth transistors being connected to each other and commonly connected through a second current source to the first voltage line, a control electrode of the third transistor being connected to the connection node between the series-connected first and second resistors and the other end of the current path of the third transistor being connected through a first load means to the second voltage line, and a control electrode of the fourth transistor being connected to a second reference voltage and the other end of the current path of the fourth transistor being connected to a second load means the second voltage line, one of the respective other ends of the respective current paths of the third and fourth transistors being connected to give the output signal.

6. An electronic switch circuit claimed in claim 5 wherein each of the first and second transistors is of the PNP type, emitters of the first and second PNP transistors being commonly connected through the first current source to a high voltage line, a collector of the first PNP transistor being grounded, and a collector of the second PNP transistor being connected to the connection node between the series-connected first and second resistor; and wherein each of the third and fourth transistors is of the PNP type, emitters of the third and fourth PNP transistors being commonly connected through the second current source to the high voltage line.

7. An electronic switch circuit claimed in claim 6 wherein a collector of the third PNP transistor being connected to a base of a first NPN transistor having a collector connected to the high voltage supply line and also to a collector of a second NPN transistor having an emitter connected to the ground, an emitter of the first NPN transistor being connected to a base of the second NPN transistor and forming a first output terminal, and a collector of the fourth PNP transistor being connected to a base of a third NPN transistor having a collector connected to the high voltage supply line and also to a collector of a fourth NPN transistor having an emitter connected to the ground, an emitter of the third NPN transistor being connected to a base of the fourth NPN transistor and forming a second output terminal.

8. An electronic switch circuit for generating an output signal which is alternatively brought either into a first condition or into a second condition dependent upon a voltage of an input signal, the electronic switch circuit comprising:

an input terminal connected to receive the input signal and connected to a connection node through a resistance means;

a bias control transistor having a current path connected between the connection node and a first voltage line; and an output differential circuit composed of first and second transistors, one end of a current path of each of the first and second transistors being connected to each other and commonly connected through a current source to the first voltage line, a control electrode of the first transistor being connected to the connected node and the other end of the current path of the first transistor being connected through a first load means to a second voltage line, and a control electrode of the second transistor being connected to a reference voltage and the other end of the current path of the second transistor being connected through a second load to the second voltage line, the reference voltage being also connected to a control electrode of the bias control transistor, one of the respective other ends of the respective current paths of the first and second transistors being connected to give the output signal.

9. An electronic switch circuit claimed in claim 8 wherein the bias control transistor is of the NPN type having a collector connected to the high voltage line and an emitter connected to the connection node, a base of the bias control transistor being connected to the reference voltage; and wherein each of the first and second transistors is of the PNP type, emitters of the first and second PNP transistors being commonly connected through the current source to the high voltage line.

10. An electronic switch circuit claimed in claim 9 wherein a collector of the first PNP transistor being connected to a base of a first NPN transistor having a collector connected to the high voltage supply line and also to a collector of a second NPN transistor having an emitter connected to the ground, an emitter of the first NPN transistor being connected to a base of the second NPN transistor and forming a first output terminal, and a collector of the second NPN transistor being connected to a base of a third NPN transistor having a collector connected to the high voltage supply line and also to a collector of a fourth NPN transistor having an emitter connected to the ground, an emitter of the third NPN transistor being connected to a base of the fourth NPN transistor and forming a second output terminal.

11. An electronic switch for generating an output signal which is alternatively brought either into a first condition or into a second condition dependent upon a voltage level of an input signal, the electronic switch circuit comprising:

first and second resistors series-connected between first and second voltage lines;

a bias control transistor having a control electrode connected to receive the input signal, a current path of the bias control transistor being connected at its one end to the first voltage line and at its other end through a connection means to a connection node between the series-connected first and second resistors; and an output differential circuit composed of first and second transistors, one end of a current path of each of the first and second transistors being connected to each other and commonly connected through a current source to the first voltage line, a control electrode of the first transistor being connected through a first load means to a second voltage line, and a control electrode of the second transistor being connected to an intermediate tap of a voltage dividing means connected between the first and second and second voltage lines and the other end of the current path of the second transistor being connected through a second load means to the second voltage line, one of the respective other ends of the respective current paths of the first and second transistors being connected to give the output signal.

12. An electronic switch circuit claimed in claim 11 wherein the bias control transistor is of the NPN type having a collector connected to the high voltage line and an emitter connected through the connection means to the connection node, a base of the bias control transistor being connected to receive the input signal; and wherein each of the first and second transistors is of the PNP type, emitters of the first and second PNP transistors being commonly connected through the current source to the high voltage line.

13. An electronic switch circuit claimed in claim 12 wherein a collector of the first PNP transistor being connected to a base of a first NPN transistor having a collector connected to the high voltage supply line and also to a collector of a secondd NPN transistor having an emitter connected to the ground, an emitter of the first NPN transistor being connected to a base of the second NPN transistor and forming a first output terminal, and a collector of the second PNP transistor being connected to a base of a third NPN transistor having a collector connected to the high voltage supply line and also to a collector of a fourth NPN transistor having an emitter connected to the ground, an emitter of the third NPN transistor being connected to a base of the fourth NPN transistor and forming a second output terminal.

14. An electronic switch circuit claimed in claim 13 wherein the connection means is composed of a resistor or a level shift means.

15. An electronic switch circuit claimed in claim 14 wherein the level shift means is composesd of a transistor connected to function as a diode.

16. An electronic switch circuit claimed in claim 13 wherein the voltage dividing means is composed of a third resistor, a voltage drop means and a fourth resistor series-connected between the high voltage line and the ground in the named order, a connection node of the voltage drop means and the fourth resistor being connected to a base of the second PNP transistor.

* * * * *